United States Patent
Ishii et al.

(10) Patent No.: US 7,433,200 B2
(45) Date of Patent: Oct. 7, 2008

(54) WIRED CIRCUIT BOARD

(75) Inventors: Jun Ishii, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 7 days.

(21) Appl. No.: 11/797,161

(22) Filed: May 1, 2007

(65) Prior Publication Data

US 2007/0253176 A1    Nov. 1, 2007

(30) Foreign Application Priority Data

May 1, 2006    (JP) .............................. 2006-127624

(51) Int. Cl.
*H05K 7/00*    (2006.01)
(52) U.S. Cl. .................... 361/760; 361/720; 361/736; 361/748; 361/741; 361/777
(58) Field of Classification Search ................ 361/760; 174/250, 260, 255, 254; 360/245.1, 245.2, 360/245.3, 245.4, 245.5, 245.6, 245.7, 245.8, 360/245.9

See application file for complete search history.

(56) References Cited

U.S. PATENT DOCUMENTS

| | | |
|---|---|---|
| 2003/0151902 A1 | 8/2003 | Kageyama et al. |
| 2004/0221447 A1 | 11/2004 | Ishii et al. |
| 2006/0118905 A1 * | 6/2006 | Himori et al. ............... 257/531 |

FOREIGN PATENT DOCUMENTS

| | | |
|---|---|---|
| JP | 2004-035825 | 2/2004 |
| JP | 2004-158480 | 6/2004 |
| JP | 2004-335700 | 11/2004 |

* cited by examiner

*Primary Examiner*—Dean A. Reichard
*Assistant Examiner*—Abiy Getachew
(74) *Attorney, Agent, or Firm*—Jean C. Edwards, Esq.; Akerman Senterfitt

(57) ABSTRACT

A wired circuit board has a metal supporting board, an insulating base layer formed on the metal supporting board, a conductive pattern formed on the insulating base layer and including at least one pair of wires arranged in mutually spaced-apart and opposed relation having different potentials, a semiconductive layer formed on the insulating base layer to cover the conductive pattern and electrically connected to the metal supporting board on one side outside a region where the pair of wires are opposed, and an insulating cover layer formed on the semiconductive layer.

3 Claims, 6 Drawing Sheets

WIRED CIRCUIT BOARD

CROSS-REFERENCE TO RELATED APPLICATION

The present application claims priority from Japanese Patent Application No. 2006-127624 filed on May 1, 2006, the content of which is hereby incorporated by reference into this application.

BACKGROUND OF THE INVENTION

1. Field of the Invention

The present invention relates to a wired circuit board and, more particularly, to a wired circuit board such as a suspension board with circuit on which an electronic component is mounted.

2. Description of Related Art

A wired circuit board such as a suspension board with circuit comprises, e.g., a metal supporting board made of a stainless steel foil or the like, an insulating base layer made of a polyimide resin or the like and formed on the metal supporting board, a conductive pattern made of a copper foil or the like and formed on the insulating base layer, and an insulating cover layer made of a polyimide resin or the like and formed on the insulating base layer to cover the conductive pattern. Such a wire circuit board is widely used in the filed of various electric and electronic equipment.

To prevent electrostatic breakdown of an electronic component mounted on such a wire circuit board, it has been proposed to form a conductive polymer layer on a cover layer and remove the electrostatic charging by means of the conductive polymer layer (see, e.g., Japanese Unexamined Patent Publication No. 2004-158480).

SUMMARY OF THE INVENTION

However, only the conductive polymer layer formed on the cover layer recited in Japanese Unexamined Patent Publication No. 2004-158480, is insufficient to remove the electrostatic charging, resulting in that the electrostatic breakdown of the mounted electronic component may not be prevented reliably.

Therefore, as shown in, e.g., FIG. 6, it has been proposed in a suspension board with circuit 31 to continuously form a semiconductive layer 35 on the respective surfaces of a conductive pattern 34, an insulating base layer 33, and a metal supporting board 32 each covered with an insulating cover layer 36 along a direction W in which a pair of wires (e.g., a read wire and a write wire) are arranged and remove the electrostatic charging of the conductive pattern 34.

However, when the semiconductive layer 35 is brought into contact with the metal supporting board 32 at the portions located on both outsides of the pair of wires 39 in the arranging direction W, the potential difference produced between the wires 39 forms an electric field E in a loop-like shape indicated by the dotted line to surround the wires 39 along the arranging direction W of the pair of wires 39. As a result, a problem arises that the metal of the metal supporting board 32 migrates (ion migration) from the contact portion between the metal supporting board 29 and the semiconductive layer 35 into the insulating cover layer 36 due to the electric field E in such a loop-like shape.

It is therefore an object of the present invention to provide a wired circuit board which can remove electrostatic charging efficiently and prevent ion migration from a metal supporting board reliably.

A wired circuit board according to the present invention comprises a metal supporting board, an insulating base layer formed on the metal supporting board; a conductive pattern formed on the insulating base layer and including at least one pair of wires arranged in mutually spaced-apart and opposed relation, each of the wires having different potential; a semiconductive layer formed on the insulating base layer to cover the conductive pattern and electrically connected to the metal supporting board on one side outside a region where the pair of wires are opposed; and an insulating cover layer formed on the semiconductive layer.

The wired circuit board according to the present invention comprises the semiconductive layer formed to cover the conductive pattern and electrically connected to the metal supporting board on one side outside the region where the pair of wires are opposed. As a result, the conductive pattern is electrically connected to the metal supporting board via the semiconductive layer and therefore static electricity with which the conductive pattern is charged can be efficiently removed. In addition, since the semiconductive layer is electrically connected to the metal supporting board on one side outside the region where the pair of wires are opposed, even when the potential difference is produced between the pair of wires, the formation of an electric field around the pair of wires can be reliably prevented. This allows reliable prevention of ion migration from the metal supporting board into the insulating cover layer.

As a result, it is possible to reliably prevent the electrostatic breakdown of the electronic component mounted thereon and also improve the connection reliably of the wire circuit board.

In the wired circuit board according to the present invention, it is preferable that the semiconductive layer is in contact with the metal supporting board on one side outside the region where the pair of wires are opposed.

In the wired circuit board according to the present invention, it is preferable that the insulating base layer has a base opening formed in a portion thereof located on one side outside the region where the pair of wires are opposed to extend therethrough in a thickness direction and a ground connection portion in contact with the metal supporting board and the semiconductive layer is provided on the metal supporting board exposed from the base opening.

DESCRIPTION OF THE PREFERRED EMBODIMENTS

Figure 1:
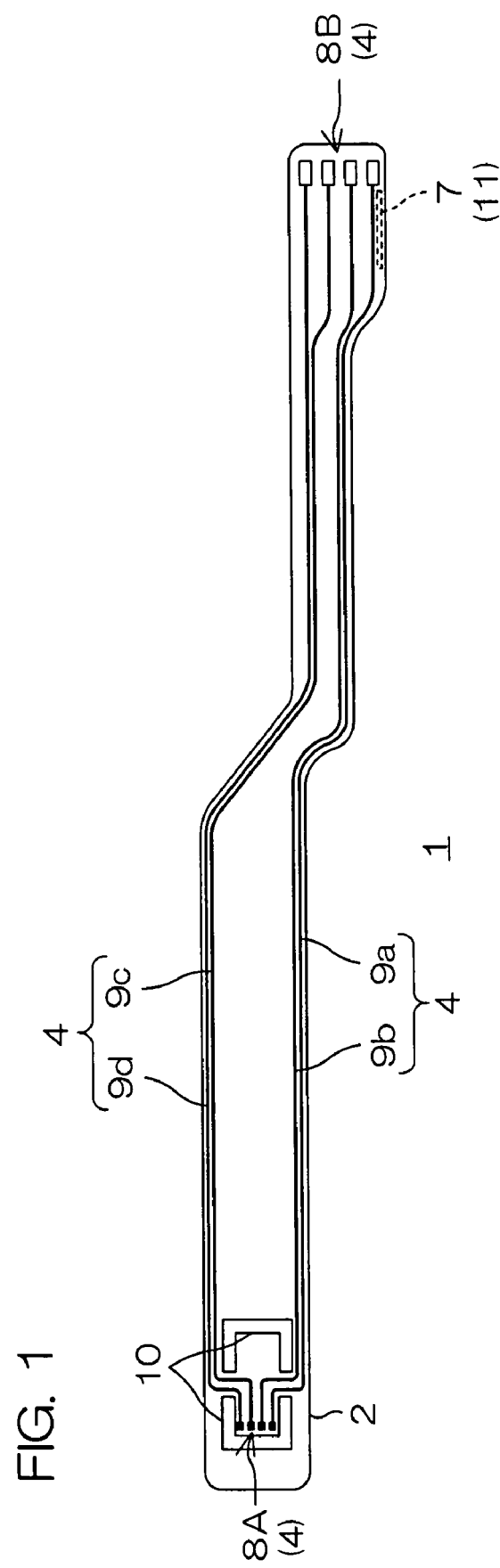
FIG. 1 is a schematic plan view showing a suspension board with circuit as an embodiment of a wired circuit board according to the present invention.
Figure 2:
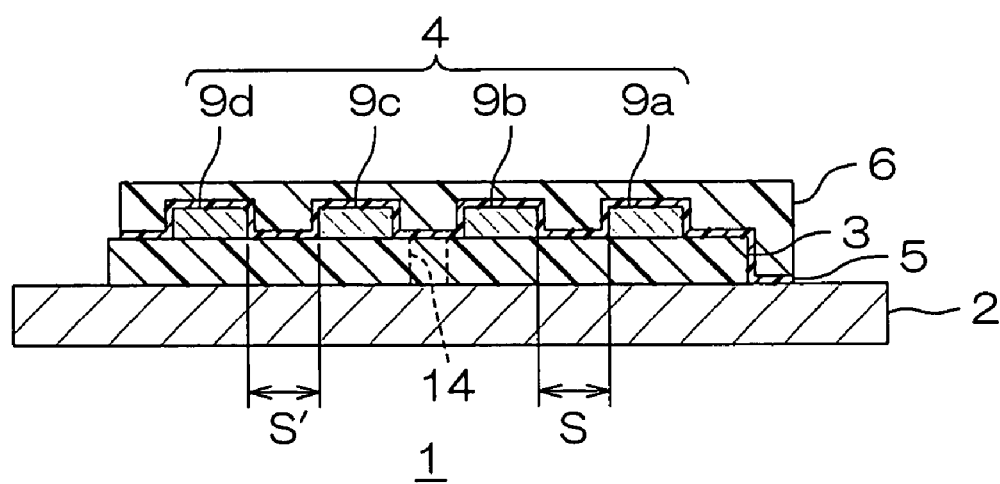
FIG. 2 is a cross-sectional view in the widthwise direction of the suspension board with circuit shown in FIG. 1.

FIG. 1 is a schematic plan view showing a suspension board with circuit as an embodiment of a wired circuit board according to the present invention. FIG. 2 is a cross-sectional view in a direction orthogonal to the longitudinal direction (which may be hereinafter simply referred to as the widthwise direction) of the suspension board with circuit shown in FIG. 1. In FIG. 1, an insulating base layer 3, a semiconductive layer 5, and an insulating cover layer 6, each described later, are omitted for clear illustration of a relative position of a conductive pattern 4 to a metal supporting board 2.

In FIG. 1, a suspension board with circuit 1 comprises the metal supporting board 2 mounted on a hard disk drive. A conductive pattern 4 connecting a magnetic head (not shown) and a read/write board is formed integrally on the metal supporting board 2. The metal supporting board 2 supports the magnetic head mounted thereon, while holding a minute gap between the magnetic head and a magnetic disk against an air flow caused when the magnetic head and the magnetic disk travel relatively to each other.

The conductive pattern 4 comprises magnetic-head-side connection terminal portions 8A, external connection terminal portions 8B, and a plurality of wires 9 for connecting the magnetic-head-side connection terminal portions 8A and the external connection terminal portions 8B, which are formed integrally and continuously.

The plurality of wires 9 are provided in the longitudinal direction of the metal supporting board 2 and arranged in mutually spaced-apart and parallel opposed relation in the widthwise direction of the metal supporting board 2.

The plurality of wires 9 are composed of one pair of wires 9a and 9b arranged in mutually spaced-apart and parallel opposed relation on one widthwise side and the other pair of wires 9c and 9d arranged in mutually spaced-apart and parallel opposed relation on the other widthwise side. Of the one pair of wires 9a and 9b, the one wire 9a is disposed outside of the widthwise direction and the other wire 9b is disposed inside of the widthwise direction. Of the other pair of wires 9c and 9d, the one wire 9c is disposed inside of the widthwise direction and the other wire 9d is disposed outside of the widthwise direction.

To the one pair of wires 9a and 9b, a read signal and a write signal having different potentials are respectively inputted so that a potential difference is constantly produced therebetween. As well as to the other pair of wires 9c and 9d, a read signal and a write signal having different potentials are respectively inputted so that a potential difference is constantly produced therebetween.

More specifically, each of the wires 9 is either a read wire for reading data on the magnetic disk or a write wire for writing data on the magnetic disk. The combination of each wires 9 in a pair is selected such that the one wire 9a is a read wire and the other wire 9b is a write wire or vice versa in one pair, and the one wire 9c is a read wire and the other wire 9d is a write wire or vice versa in the other pair.

The plurality of magnetic-head-side connection terminal portions 8A are provided as wide lands and arranged in parallel at the front end portion of the metal supporting board 2 and connected individually to the respective front end portions of the wires 9. To the magnetic-head-side connection terminal portions 8A, terminal portions (not shown) of the magnetic head are connected.

The plurality of external connection terminal portions 8B are provided as wide lands and arranged in parallel at the rear end portion of the metal supporting board 2 and connected individually to the respective rear end portions of the wires 9. To the external connection terminal portions 8B, terminal portions (not shown) of the read/write board are connected.

The front end portion of the metal supporting board 2 is provided with a gimbal 10 for mounting the magnetic head. The gimbal 10 is formed by cutting out the metal supporting board 2 to sandwich the magnetic-head-side connection terminal portions 8A in the longitudinal direction.

As shown in FIG. 2, the suspension board with circuit 1 comprises the metal supporting board 2, the insulating base layer 3 formed on the metal supporting board 2, the conductive pattern 4 formed on the insulating base layer 3, the semiconductive layer 5 formed on the insulating base layer 3 to cover the conductive pattern 4 and in contact with the metal supporting board 2 only on one widthwise side (right-hand side of FIG. 2) outside a region S where the one pair of wires 9a and 9b are opposed, and the insulating cover layer 6 formed on the semiconductive layer 5.

The metal supporting board 2 is formed of a flat thin plate extending longitudinally in correspondence to the outer shape of the suspension board with circuit 1 described above.

The length (longitudinal length) and width (widthwise length) of the metal supporting board 2 are selected appropriately depending on the purpose and application.

The insulating base layer 3 is formed on the metal supporting board 2 to have a pattern to expose the peripheral end portion of the metal supporting board 2 in correspondence to the portion where the conductive pattern 4 is formed.

The length and width of the insulating base layer 3 is selected appropriately to provide the shape described above depending on the purpose and application.

The conductive pattern 4 is formed as a wired circuit pattern integrally comprising the plurality of wires 9 (the one pair of wires 9a and 9b, and the other pair of wires 9c and 9d) arranged on the insulating base layer 3 in mutually spaced-apart and parallel opposed relation as described above, the magnetic-head-side connection terminal portions 8A connected to the respective front end portions of the wires 9, and the external connection terminal portions 8B connected to the respective rear end portions of the wires 9. Each of the magnetic-head-side connection terminal portions 8A and the external connection terminal portions 8B is hereinafter simply described as a terminal portion 8 when distinction therebetween is not particularly needed.

The width of each of the wires 9 is in the range of, e.g., 10 to 100 μm, or preferably 15 to 50 μm. The spacing between each pair of the wires 9 is in the range of, e.g., 10 to 100 μm, or preferably 15 to 50 μm.

The width of each of the terminal portions 8 is in the range of, e.g., 20 to 1000 μm, or preferably 30 to 800 μm. The spacing between the respective terminal portions 8 is in the range of, e.g., 20 to 1000 μm, or preferably 30 to 800 μm.

As necessary, the suspension board with circuit 1 comprises a metal thin film, though not shown, to be interposed between the conductive pattern 4 and the semiconductive layer 5 to cover the conductive pattern 4 depending the purpose and application.

The metal thin film, which is not shown, is formed as necessary on the surface of the conductive pattern 4, i.e., on the respective upper and side surfaces of the wires 9 of the conductive pattern 4.

The semiconductive layer 5 is formed on the insulating base layer 3 and the metal supporting board 2 each covered with the insulating cover layer 6 to cover the conductive pattern 4. Specifically, the semiconductive layer 5 is interposed between the insulating cover layer 6 and each of the metal supporting board 2, the insulating base layer 3, and the conductive pattern 4.

More specifically, the semiconductive layer 5 is formed widthwise continuously on the upper and side surfaces of the conductive pattern 4 (or the upper and side surfaces of the metal thin film when the conductive pattern 4 is covered with the metal thin film), on the upper surface of the insulating base layer 3 exposed from the conductive pattern 4, on the side surface of the insulating base layer 3 on one widthwise side (right-hand side of FIG. 2) outside the region S where the one pair of wires 9a and 9b are opposed, and on the upper surface of the metal supporting board 2 continued to the side surface.

The semiconductive layer 5 is also formed such that the peripheral end portion (the upper and side surfaces of the end portion on the other widthwise side) of the insulating base layer 3 and the peripheral end portion (the upper surface of the end portion on the other widthwise side) of the metal supporting board 2 are exposed on the other widthwise side (left-hand side of FIG. 2, i.e., the widthwise side outside the other pair of wires 9c and 9d, hereinafter referred to as such) outside the region S where the one pair of wires 9a and 9b are opposed.

That is, the semiconductive layer 5 is in contact with the metal supporting board 2 outside the peripheral end portion of the insulating base layer 3 on one widthwise side (right-hand side) outside the region S where the one pair of wires 9a and 9b are opposed. As a result, the semiconductive layer 5 is electrically connected to the metal supporting board 2 on one widthwise side (right-hand side) outside the region S where the one pair of wires 9a and 9b are opposed.

On the other hand, the semiconductive layer 5 is not in contact with the metal supporting board 2 widthwise outside the peripheral end portion of the insulating base layer 3 on the other widthwise side (left-hand side) to the region S where the one pair of wires 9a and 9b are opposed. As a result, the semiconductive layer 5 is electrically interrupted from the metal supporting board 2 on the other widthwise side outside the region S.

The length (longitudinal length) of a contact portion between the semiconductive layer 5 and the upper surface of the metal supporting board 2 is selected appropriately depending on the purpose and application. The width (widthwise length) of the contact portion is in the range of, e.g., 50 to 50000 μm, or preferably 100 to 20000 μm.

The insulating cover layer 6 is formed on the semiconductive layer 5, more specifically, provided at the same position as the semiconductive layer 5 when viewed in plan view.

That is, the insulating cover layer 6 is formed continuously along the widthwise direction on the upper and side surfaces of the semiconductive layer 5 formed on the upper and side surfaces of the conductive pattern 4, on the upper and side surfaces of the semiconductive layer 5 formed on the upper and side surfaces (except for the upper and side surfaces of the peripheral end of the insulating base layer 3 on the other widthwise side (left-hand side) outside the region S where the one pair of wires 9a and 9b are opposed) of the insulating base layer 3 exposed from the conductive pattern 4, and on the upper surface of the semiconductive layer 5 formed on the upper surface of the metal supporting board 2 exposed from the insulating base layer 3 on one widthwise side (right-hand side) outside the region S where the one pair of wires 9a and 9b are opposed.

The insulating cover layer 6 has an opening, though not shown, which is formed in a portion corresponding to a terminal portion 8 of the conductive pattern 4 to expose the terminal portion 8 therefrom.

The length and width of the insulating cover layer 6 are selected appropriately to provide the shape described above depending on the purpose and application.

The suspension board with circuit 1 has a metal plating layer, though not shown, which is formed on the upper surface of the terminal portion 8.

Figure 3:
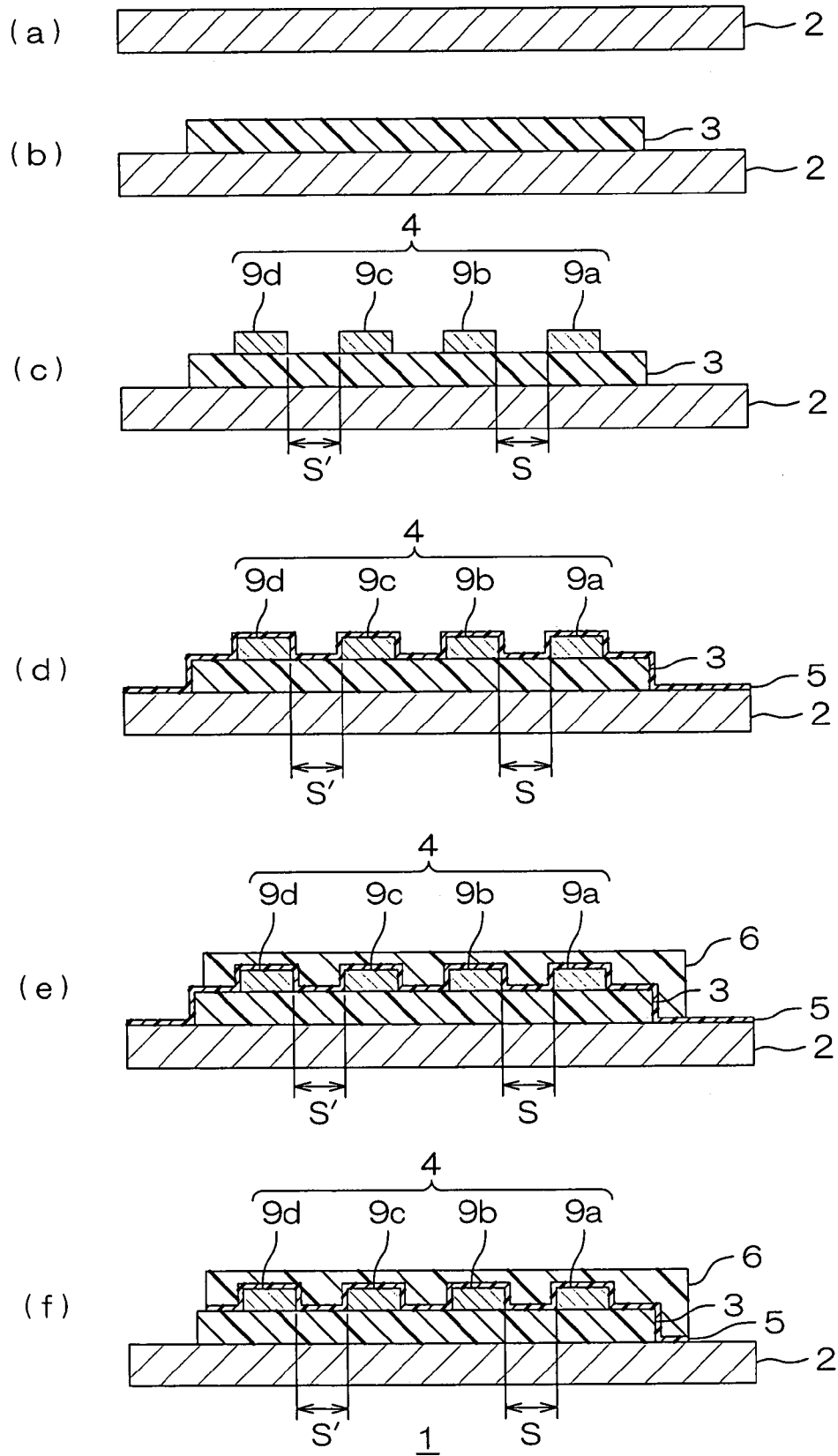
FIG. 3 is a cross-sectional view showing process steps for producing the suspension board with circuit shown in FIG. 2, (a) showing the step of preparing a metal supporting board, (b) showing the step of forming an insulating base layer on the metal supporting board, (c) showing the step of forming a conductive pattern as a wired circuit pattern, (d) showing the step of continuously forming a semiconductive layer on the entire surfaces of the conductive pattern, the insulating base layer, and the metal supporting board, (e) showing the step of forming an insulating cover layer on the semiconductive layer, and (f) showing the step of removing the semiconductive layer exposed from the insulating cover layer.

FIG. 3 is a cross-sectional view showing process steps for producing the suspension board with circuit shown in FIG. 2.

Next, a description is given to a method for producing the suspension board with circuit 1 with reference to FIG. 3.

First, as shown in FIG. 3(*a*), the metal supporting board 2 is prepared in the method.

For the metal supporting board 2, a foil of a metal such as, e.g., stainless steel, a 42-alloy, aluminum, copper, a copper-beryllium alloy, or phosphor bronze is used, or preferably a stainless steel foil is used. The thickness of the metal supporting board 2 is in the range of, e.g., 10 to 70 μm, or preferably 15 to 30 μm.

Then, as shown in FIG. 3(*b*), the insulating base layer 3 is formed on the metal supporting board 2 to correspond to the portion where the conductive pattern 4 is formed, and to expose the peripheral end portion of the metal supporting board 2.

The insulating base layer 3 is made of a resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. In terms of heat resistance, the insulating base layer 3 is preferably made of the polyimide resin.

The method for forming the insulating base layer 3 in the foregoing pattern is not particularly limited and a known method is used. For example, a varnish of a photosensitive resin (photosensitive polyamic acid resin) is coated on a surface of the metal supporting board 2 and the coated varnish is dried to form a base coating. Then, the base coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating base layer 3 thus formed is in the range of, e.g., 5 to 30 μm, or preferably 8 to 15 μm.

Next, as shown in FIG. 3(*c*), the conductive pattern 4 is formed on the insulating base layer 3 as a wired circuit pattern integrally comprising the plurality of wires 9 arranged in mutually spaced-apart and parallel opposed relation, the magnetic-head-side connection terminal portions 8A connected to the respective front end portions of the wires 9, and the external connection terminal portions 8B connected to the respective rear end portions of the wires 9.

The conductive pattern 4 is made of, e.g., a conductive material such as, e.g., copper, nickel, gold, a solder, or an alloy thereof, or preferably made of copper. The conductive pattern 4 is formed as the foregoing wired circuit pattern on the upper surface of the insulating base layer 3 by a known patterning method such as, e.g., an additive method or a subtractive method. Preferably, the conductive pattern 4 is formed by the additive method.

In the additive method, a conductive thin film is formed first on the surface of the insulating base layer 3. To form the conductive thin film, a chromium thin film and a copper thin film are laminated by sputtering, or preferably by chromium sputtering and copper sputtering.

Then, a plating resist is formed in a pattern reverse to the wired circuit pattern of the conductive pattern 4 on the upper surface of the conductive thin film. Then, the conductive pattern 4 is formed on the upper surface of the conductive thin film exposed from the plating resist by electrolytic plating. Thereafter, the plating resist and the portion of the conductive thin film on which the plating resist is laminated are removed.

In the subtractive method, a conductive layer is laminated first on the respective upper surfaces of the insulating base layer 3 and the metal supporting board 2 via an adhesive layer as necessary. Then, an etching resist having an identical pattern as the wired circuit pattern of the conductive pattern 4 is formed on the conductive layer and, using the etching resist as a resist, the conductive layer is etched. Thereafter, the etching resist is removed.

The conductive pattern 4 thus formed has a thickness in the range of, e.g., 3 to 30 μm, or preferably 5 to 20 μm.

Then, a metal thin film, though not shown, is formed as necessary on the surface of the conductive pattern 4.

The metal thin film is made of a metal such as, e.g., nickel, gold, tin, chromium, titanium, zirconium, or an alloy thereof, or preferably, made of nickel.

The metal thin film is formed on the surface of the conductive pattern 4 by, e.g., an electrolytic or electroless plating method, a sputtering method using the metal listed above as a target, or the like. Preferably, the metal thin film is formed by electroless plating.

In the electroless plating, the suspension board with circuit 1 in the production process shown in FIG. 3(c) is dipped in a plating solution of the metal listed above to form the metal thin film.

The metal thin film thus formed as necessary has a thickness in the range of, e.g., 0.01 to 0.5 μm, or preferably 0.05 to 0.3 μm.

Then, as shown in FIG. 3(d), the semiconductive layer 5 is formed continuously in the foregoing pattern on the entire surface of the conductive pattern 4 (or the entire surface of the metal thin film when the conductive pattern 4 is covered with the metal thin film), on the entire surface of the insulating base layer 3 exposed from the conductive pattern 4, and on the entire surface of the metal supporting board 2 exposed from the insulating base layer 3.

As a semiconductive material forming the semiconductive layer 5, a metal or a resin is used.

For example, a metal oxide or the like is used as the metal. Examples of the metal oxide include chromium oxide, nickel oxide, copper oxide, titanium oxide, zirconium oxide, indium oxide, aluminum oxide, and zinc oxide. Preferably, chromium oxide is used.

The method for forming the semiconductive layer 5 made of a metal oxide is not particularly limited. For example, the method such as a method of oxidizing a metal using a metal as a target after sputtering by heating as necessary, a method of reactive sputtering, or a method of sputtering using a metal oxide as a target is used.

In the method of oxidizing a metal using a metal as a target after sputtering by heating as necessary, the semiconductive layer 5 made of a metal oxide is formed by, e.g., a method of sputtering a metal such as chromium as a target, while introducing an inert gas such as argon, and then oxidizing the metal in an atmosphere at a temperature of 50 to 400° C. for 1 minute to 12 hours using a heating furnace or the like as necessary.

In the method of reactive sputtering, the semiconductive layer 5 made of a metal oxide is formed by, e.g., sputtering a metal such as chromium as a target in a sputtering apparatus, while introducing a reactive gas containing oxygen.

In the method of sputtering a metal oxide as a target, the semiconductive layer 5 made of a metal oxide is formed by, e.g., sputtering a metal oxide such as chromium oxide as a target in a sputtering apparatus, while introducing an inert gas such as argon, Such a semiconductive layer 5 can be formed in accordance with the description of Japanese Unexamined Patent Publication No. 2004-335700.

As the resin, there can be used, e.g., a semiconductive resin composition in which conductive particles are dispersed or the like.

The semiconductive resin composition contains, e.g., an imide resin or an imide resin precursor, conductive particles, and a solvent.

As the imide resin, a known imide resin can be used. For example, polyimide, polyether imide, polyamide imide, or the like is used.

As the imide resin precursor, there can be used an imide resin precursor disclosed in, e.g., Japanese Unexamined Patent Publication No. 2004-35825. For example, a polyamic acid resin is used.

As the conductive particles, there can be used, e.g., conductive polymer particles, carbon particles, metal particles, metal oxide particles, or the like.

As the conductive polymer particles, there can be used, e.g., particles of polyaniline, polypyrrole, polythiophene, or the like or particles of a derivative thereof Preferably, particles of polyaniline are used. To the conductive polymer particles, conductivity is imparted by doping with a dopant.

As the dopant, there can be used, e.g., a p-toluenesulfonic acid, a dodecylbenzenesulfonic acid, an alkylnaphthalenesulfonic acid, a polystyrenesulfonic acid, a p-toluenesulfonic acid novolac resin, a p-phenolsulfonic acid novolac resin, a β-naphthalenesulfonic acid formalin condensate, or the like.

The doping may be performed by either preliminarily mixing the dopant in the solvent in which the conductive polymer particles are dispersed (dissolved) or after forming the semiconductive layer 5 and then dipping the suspension board with circuit 1 formed with the semiconductive layer 5 in the production process in a solution of the dopant.

As the carbon particles, there are used, e.g., particles of a carbon black, a carbon nanofiber.

As the metal particles, there are used, e.g., particles of chromium, nickel, copper, titanium, zirconium, indium, aluminum, zinc, or the like.

As the particles of a metal oxide, there are used particles of, e.g., chromium oxide, nickel oxide, copper oxide, titanium oxide, zirconium oxide, indium oxide, aluminum oxide, zinc oxide, or the like, or particles of a composite oxide thereof, more specifically particles of a composite oxide of indium oxide and tin oxide (ITO particles), particles of a composite oxide of tin oxide and phosphorus oxide (PTO particles), or the like.

The conductive particles can be used alone or in a combination of two or more thereof. Preferably, the ITO particles are used.

The conductive particles have an average particle diameter in the range of, e.g., 10 nm to 1 μm, preferably 10 nm to 400 nm, or more preferably 10 nm to 100 nm. When the conductive particles are made of a carbon nanofiber, the diameters thereof are in the range of, e.g., 100 to 200 nm and the lengths thereof are in the range of, e.g., 5 to 20 μm. When the average particle diameter is under the range shown above, the adjustment of the average particle diameter may be difficult. When the average particle diameter is over the range shown above, it may result in unsuitableness for coating.

The solvent is not particularly limited as long as the imide resin or the imide resin precursor and the conductive particles can be dispersed (dissolved) therein. For example, an aprotic polar solvent such as N-methyl-2-pyrrolidone (NMP), N,N-dimethylacetoamide, N,N-dimethylformamide, or dimethylsulfoxide is used. The solvents may be used alone or in a combination of two or more thereof.

The semiconductive resin composition can be prepared by mixing the imide resin or the imide resin precursor, the conductive particles, and the solvent.

The mixing ratio of the conductive particles is such that, e.g., 1 to 300 parts by weight, or preferably 5 to 100 parts by weight of the conductive particles to 100 parts by weight of the imide resin or the imide resin precursor. When the mixing ratio of the conductive particles is lower than the range shown above, the conductivity may be insufficient. When the mixing ratio of the conductive particles is higher than the range shown above, the excellent film properties of the imide resin or the imide resin precursor may be impaired.

The solvent is mixed such that the ratio of the total amount of the imide resin or the imide resin precursor and the conductive particles to the amount of the semiconductive resin composition is, e.g., 1 to 40 wt % (in solids concentration), or preferably 5 to 30 wt % (in solids concentration). When the solids concentration is either higher or lower than the range shown above, it may be difficult to adjust to a target film thickness.

The semiconductive resin composition prepared above is uniformly coated on the entire surface of the conductive pattern 4, on the entire surface of the insulating base layer 3 exposed from the conductive pattern 4, and on the entire surface of the metal supporting board 2 exposed from the insulating base layer 3 by a known coating method such as a roll coating method, a gravure coating method, a spin coating method, or a bar coating method. Thereafter, the coating is dried by heating at a temperature of, e.g., 60 to 250° C., or preferably 80 to 200° C. for, e.g., 1 to 30 minutes, or preferably 3 to 15 minutes.

When the semiconductive resin composition contains the imide resin precursor, the imide resin precursor is cured (imidized) by, e.g., heating at a temperature of not less than 250° C. under a reduced pressure.

In this manner, the semiconductive layer 5 can be formed continuously on the entire surface of the conductive pattern 4, on the entire surface of the insulating base layer 3 exposed from the conductive pattern 4, and on the entire surface of the metal supporting board 2 exposed from the insulating base layer 3.

The thickness of the semiconductive layer 5 thus formed is in the range of, e.g., 2 to 150 nm, or preferably 3 to 100 nm.

The surface resistance value of the semiconductive layer 5 is set to a value in the range of, e.g., $10^5$ to $10^{13}$ Ω/□, preferably $10^5$ to $10^{11}$ Ω/□, or more preferably $10^6$ to $10^9$ Ω/□. When the surface resistance value is under the foregoing range, there may be a case where the misoperation of the electronic component (magnetic head) mounted thereon occurs. When the surface resistance value of the semiconductive layer 5 is over the foregoing range, there may be a case where the electrostatic breakdown cannot be prevented.

Then, as shown in FIG. 3(e), the insulating cover layer 6 is formed in the foregoing pattern on the semiconductive layer 5.

The insulating cover layer 6 is made of the same resin as used to form the insulating base layer 3, preferably a photosensitive synthetic resin, or more preferably photosensitive polyimide.

The method for forming the insulating cover layer 6 in the foregoing pattern is not particularly limited and a known method is used. For example, a varnish of a photosensitive resin (photosensitive polyamic acid resin) is coated on the surface of the semiconductive layer 5 and the coated varnish is dried to form a cover coating. Then, the cover coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating cover layer 6 thus formed is in the range of, e.g., 2 to 10 μm, or preferably 3 to 5 μm.

Then, as shown in FIG. 3(f), the semiconductive layer 5 exposed from the insulating cover layer 6 is removed by etching. As the etching, wet etching is performed using an aqueous alkaline solution such as an aqueous potassium hydroxide solution as an etchant and using the insulating cover layer 6 as an etching resist by a dipping method or a spraying method.

In this manner, the semiconductive layer 5 can be formed at the same position as the insulating cover layer 6 when viewed in plan view.

Then, when the conductive pattern 4 is covered with a metal thin film, the metal thin film formed on the upper surface of the terminal portion 8 is removed by the same etching as described above as necessary.

Thereafter, a metal plating layer, which is not shown, is formed on the upper surface of the terminal portion 8 and then the metal supporting board 2 is cut out by chemical etching to form the gimbal 10 and then trimmed as shown in FIG. 1, whereby the suspension board with circuit 1 is obtained.

The suspension board with circuit 1 comprises the semiconductive layer 5 formed to cover the conductive pattern 4 and electrically connected to the metal supporting board 2 on one widthwise side (right-hand side of FIG. 2) outside the region S where the one pair of wires 9a and 9b are opposed.

As a result, the conductive pattern 4 is electrically connected to the metal supporting board 2 via the semiconductive layer 5. This allows efficient removal of static electricity with which the conductive pattern 4 is charged.

On the other hand, the semiconductive layer 5 is electrically interrupted from the metal supporting board 2 on the other widthwise side (left-hand side) outside the region S where the one pair of wires 9a and 9b are opposed. Therefore, even when the potential difference is produced between the one pair of wires 9a and 9b, the formation of an electric field, i.e., the electric field E in a loop-like shape as indicated by the dotted line in FIG. 6 around the one pair of wires 9a and 9b can be reliably prevented.

This allows reliable prevention of ion migration from the metal supporting board 2 into the insulating cover layer 6.

As a result, it is possible to reliably prevent the electrostatic breakdown of the electronic component mounted thereon and also improve the connection reliability of the suspension board with circuit 1.

In the description given above, the semiconductive layer 5 is formed on the upper surface of the metal supporting board 2 on one widthwise side (right-hand side of FIG. 2) outside the region S where the one pair of wires 9a and 9b are opposed. However, it is also possible to form the semiconductive layer 5 only on, e.g., the other widthwise side (left-hand side) outside the region S where the one pair of wires 9a and 9b are opposed.

More specifically, though it is not illustrated, the semiconductor layer 5 is formed on the side surface of the insulating base layer 3 on the widthwise side outside the other (widthwise outer) wire 9d forming the other pair of wires 9 and on the upper surface of the metal supporting board 2 continued to the side surface, while the semiconductor layer 5 is prevented from being formed on the upper surface of the metal supporting board 2 on one widthwise side (right-hand side) outside the region S where the one pair of wires 9a and 9b are opposed, i.e., on the widthwise side (right-hand side) outside the one (widthwise outer) wire 9a forming the one pair of wires 9.

Alternatively, an opening 14 extending through in the thickness direction is formed between the other (widthwise inner) wire 9b forming the one pair of wires 9 and the one (widthwise inner) wire 9c forming the other pair of wires 9 as indicated by the dotted line in FIG. 2 and the semiconductive layer 5 is formed on the upper surface of the metal supporting board 2 exposed from the opening 14, while the semiconductive layer 5 is prevented from being formed on the upper surface of the metal supporting board 2 on the widthwise one outer side (right-hand side) of the region S where the one pair of wires 9a and 9b are opposed, i.e., on the widthwise side (right-hand side) outside the one (widthwise outer) wire 9a forming the one pair of wires 9.

Although the description is given above using the one pair of wires 9a and 9b and the region S where the one pair of wires 9a and 9b are opposed as a reference, the same description can be given even when the other pair of wires 9c and 9d and a region S' where the other pair of wires 9c and 9d are opposed is used as a reference.

For example, as shown in FIG. 2, the semiconductive layer 5 is formed on the upper surface of the metal supporting board 2 only on one widthwise side (right-hand side) outside the region S' where the other pair of wires 9c and 9d are opposed.

No matter which one of the region S where the one pair of wires 9a and 9b are opposed and the region S' where the other pair of wires 9c and 9d are opposed is used as a reference, the suspension board with circuit 1 shown in FIG. 2 has the semiconductive layer 5 formed in the portion thereof located on one widthwise side (right-hand side) outside the region S or the region S'.

Figure 4:
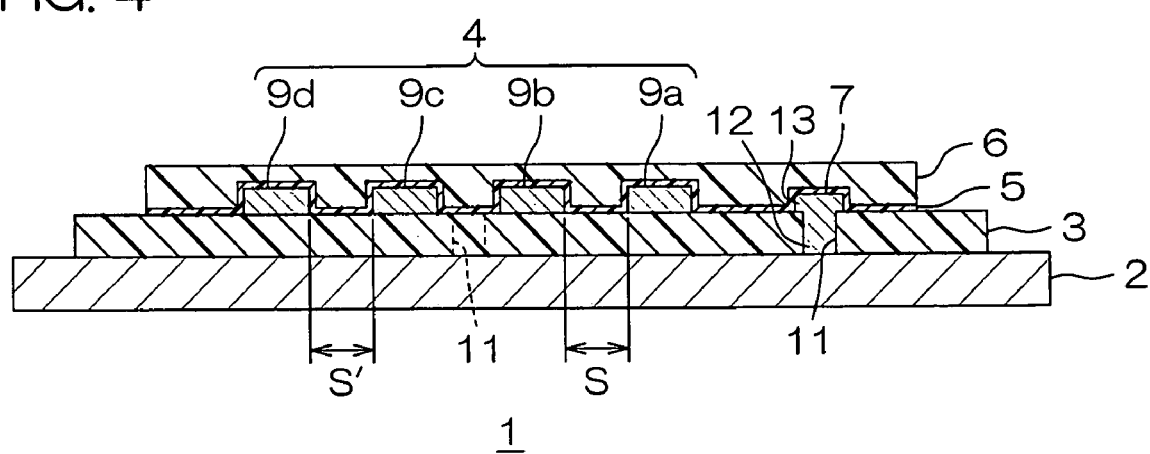
FIG. 4 is a cross-sectional view in the widthwise direction of a suspension board with circuit as another embodiment of the wired circuit board according to the present invention.

FIG. 4 is a cross-sectional view in the widthwise direction of a suspension board with circuit as another embodiment of the wired circuit board according to the present invention. As for the components shown in FIG. 4 which correspond to the respective components described above, the detailed description is omitted using the same reference numerals.

The wired circuit board according to the other embodiment of the present invention is described with reference to FIG. 4.

In the description given above, the semiconductive layer 5 of the suspension board with circuit 1 is brought into direct contact with the metal supporting board 2 on one widthwise side (right-hand side of FIG. 2) outside the region S where the one pair of wires 9a and 9b are opposed. However, instead of bringing the semiconductive layer 5 into direct contact with the metal supporting board 2, it is also possible to, e.g., form a base opening 11 extending through in the thickness direction is formed in the insulating base layer 3 located only on one widthwise side (right-hand side of FIG. 4) outside the region S where the one pair of wires 9a and 9b are opposed. To form a ground connection portion 7 that contacts the metal supporting board 2 and the semiconductive layer 5 on the metal supporting board 2 exposed from the base opening 11, it is possible to electrically connect the semiconductive layer 5 to the metal supporting board 2 via the ground connection portion 7, as shown in FIG. 4.

The resulting suspension board with circuit 1 comprises the metal supporting board 2, the insulating base layer 3 formed on the metal supporting board 2, the conductive pattern 4 formed on the insulating base layer 3, the ground connection portion 7 formed on the metal supporting board 2, the semiconductive layer 5 formed on the insulating base layer 3 to cover the conductive pattern 4 and the ground connection portion 7, and the insulating cover layer 6 formed on the semiconductive layer 5.

The insulating base layer 3 is formed on the metal supporting board 2 to have a pattern to expose the portion where the ground connection portion 7 and the peripheral end portion of the metal supporting board 2 are formed in correspondence to the portion where the conductive pattern 4 is formed.

More specifically, to form the ground connection portion 7, the base opening 11 is formed in the insulating base layer 3 located on one widthwise side (right-hand side) outside the region S where the one pair of wires 9a and 9b are opposed to extend through the thickness direction having widthwise outwardly spaced-apart relation with the one (widthwise outer) wire 9a of the one pair of wires 9.

The base opening 11 is formed in a generally rectangular shape extending in the longitudinal direction, as indicated by the dotted line in FIG. 1.

As shown in FIG. 4, the ground connection portion 7 integrally and continuously comprises a lower part 12 formed to fill in the base opening 11 of the insulating base layer 3 described above and an upper part 13 formed to protrude outwardly from the upper end of the lower part 12.

The lower surface of the lower part 12 of the ground connection portion 7 is in contact with the metal supporting board 2.

As necessary, a metal thin film is formed on the surface of the upper part 13 of the ground connection portion 7.

The width of the lower part 12 of the ground connection portion 7 is in the range of, e.g., 40 to 120 μm, or preferably 80 to 100 μm. The width of the upper part 13 of the ground connection portion 7 is in the range of, e.g., 60 to 300 μm, or preferably 80 to 200 μm. The respective lengths of the lower part 12 and upper part 13 of the ground connection portion 7 are selected appropriately depending on the object and application.

The semiconductive layer 5 is formed on the insulating base layer 3 covered with the insulating cover layer 6 to cover the conductive pattern 4 and the ground connection portion 7. That is, the semiconductive layer 5 is formed to be interposed between the insulating cover layer 6 and each of the insulating base layer 3, the conductive pattern 4, and the ground connection portion 7.

The semiconductive layer 5 is also formed on the insulating base layer 3 to expose the peripheral end portion of the insulating base layer 3 widthwise outside the ground connection portion 7.

That is, the semiconductive layer 5 is in contact with the upper part 13 of the ground connection portion 7 at the lower part in the thickness direction on one widthwise side (right-hand side of FIG. 4) outside the region S where the one pair of wires 9a and 9b are opposed and is therefore electrically connected to the metal supporting board 2 via the ground connection portion 7.

On the other hand, the semiconductive layer 5 is not in contact with the peripheral end portion of the metal supporting board 2 on both widthwise sides outside the region S where the one pair of wires 9a and 9b are opposed and is therefore electrically interrupted.

Figure 5:
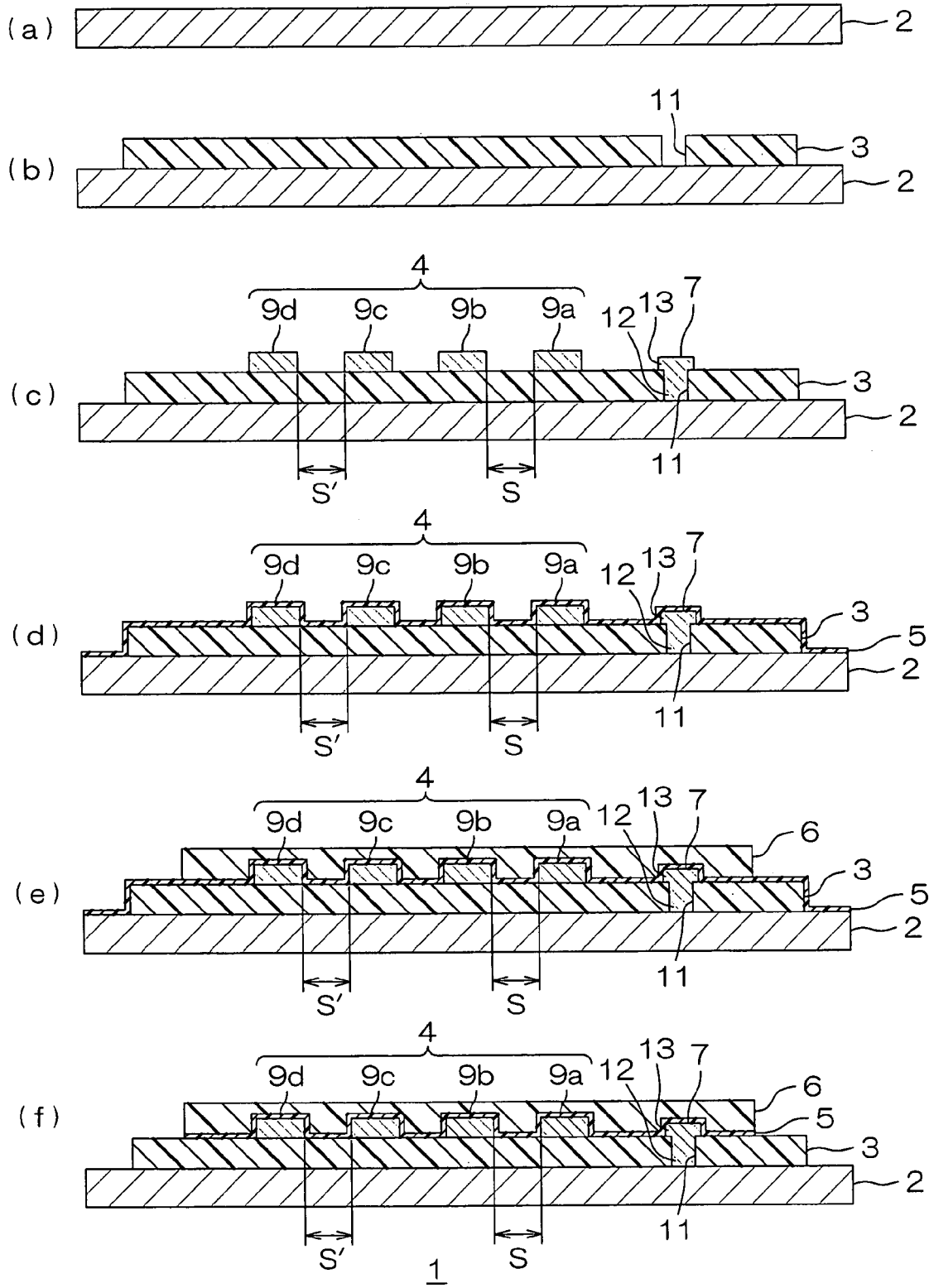
FIG. 5 is a cross-sectional view showing process steps for producing the suspension board with circuit shown in FIG. 4, (a) showing the step of preparing a metal supporting board, (b) showing the step of forming an insulating base layer on the metal supporting board such that a base opening is formed therein, (c) showing the step of simultaneously forming a conductive pattern and a ground connection portion, (d) showing the step of continuously forming a semiconductive layer on the entire surfaces of the conductive pattern, the ground connection portion, the insulating base layer, and the metal supporting board, (e) showing the step of forming an insulating cover layer on the semiconductive layer, and (f) showing the step of removing the semiconductive layer exposed from the insulating cover layer.

FIG. 5 is a cross-sectional view showing process steps for producing the suspension board with circuit shown in FIG. 4.

Next, a description is given to a method for producing the suspension board with circuit 1 with reference to FIG. 5.

First, as shown in FIG. 5(a), the metal supporting board 2 is prepared in the method.

For the metal supporting board 2, the same metal foil as mentioned above is used, or preferably a stainless steel foil is used. The thickness of the metal supporting board 2 is the same as mentioned above, or preferably, in the range of, e.g., 15 to 30 µm.

Next, as shown in FIG. 5(b), the insulating base layer 3 is formed on the metal supporting board 2 in a pattern to correspond to the portion where the conductive pattern 4 and to form with the base opening 11.

The insulating base layer 3 is made of the same resin as mentioned above, or preferably made of a polyimide resin. To form the insulating base layer 3 in the foregoing pattern, the same method as described above is used. The thickness of the insulating base layer 3 is the same as mentioned above, or preferably in the range of 8 to 15 µm.

Next, as shown in FIG. 5(c), the conductive pattern 4 is formed as the foregoing wired circuit pattern on the insulating base layer 3, while the ground connection portion 7 is simultaneously formed on the metal supporting board 2 exposed from the base opening 11 of the insulating base layer 3 such that the lower part 12 of the ground connection portion 7 fills in the base opening 11 of the insulating base layer 3 and the upper part 13 thereof covers the end edge of the base opening 11.

The conductive pattern 4 and the ground connection portion 7 are made of the same conductive material as mentioned above, or preferably made of copper. The conductive pattern 4 and the ground connection portion 7 are formed simultaneously in the foregoing pattern on the upper surfaces of the insulating base layer 3 and the metal supporting board 2 by the same patterning method described above, or preferably by the additive method.

The thickness of the conductive pattern 4 thus formed is the same as mentioned above, or preferably in the range of 5 to 20 µm. The thickness of the upper part 13 of the ground connection portion 7 is in the range of 2 to 30 µm, or preferably in the range of 3 to 20 µm. The thickness of the lower part 12 of the ground connection portion 7 is the same as the thickness of the insulating base layer 3.

Next, a metal thin film, though not shown, is formed as necessary on the respective surfaces of the conductive pattern 4 and the upper part 13 of the ground connection portion 7.

The metal thin film is made of the same metal as mentioned above, or preferably made of nickel.

The metal thin film is formed on, e.g., the surfaces of the conductive pattern 4 and the upper part 13 of the ground connection portion 7 by the same method as mentioned above, or preferably by electroless plating. The thickness of the metal thin film formed as necessary is the same as mentioned above, or preferably in the range of 0.05 to 0.3 µm.

Next, as shown in FIG. 5(d), the semiconductive layer 5 is formed continuously on the entire surface of the conductive pattern 4 (or the entire surface of the metal thin film when the conductive pattern 4 is covered with the metal thin film), on the entire surface of the upper part 13 of the ground connection portion 7 (or the entire surface of the metal thin film when the upper part 13 of the ground connection portion 7 is covered with the metal thin film), on the entire surface of the insulating base layer 3 exposed from the conductive pattern 4 and the upper part 13 of the ground connection portion 7, and on the entire surface of the metal supporting board 2 exposed from the insulating base layer 3.

As a semiconductive material forming the semiconductive layer 5, the same metal or resin as mentioned above is used. The thickness of the semiconductive layer 5 is the same as mentioned above, or preferably in the range of 3 to 100 nm. The surface resistance value of the semiconductive layer 5 is the same as mentioned above.

Next, as shown in FIG. 5(e), the insulating cover layer 6 is formed in the foregoing pattern on the semiconductive layer 5.

The insulating cover layer 6 is made of the same resin as mentioned above, preferably a photosensitive synthetic resin, or more preferably photosensitive polyimide.

To form the insulating cover layer 6 in the foregoing pattern, the same method as mentioned above is used. The thickness of the insulating cover layer 6 is the same as mentioned above, or preferably in the range of 3 to 5 µm.

Next, as shown in FIG. 5(f), the semiconductive layer 5 exposed from the insulating cover layer 6 is removed by etching using the insulating cover layer 6 as an etching resist in the same manner as described above.

Next, when the conductive pattern 4 is covered with the metal thin film as necessary, the metal thin film formed on the upper surface of each of the terminal portions 8 is removed by the same etching as described above.

Then, a metal plating layer, not shown, is formed as necessary on the upper surface of the terminal portion 8. Thereafter, the metal supporting board 2 is cut out by chemical etching to form the gimbal 10 and then trimmed as shown in FIG. 1, whereby the suspension board with circuit 1 is obtained.

In the suspension board with circuit 1, the semiconductive layer 5 is kept from direct contact with the metal supporting board 2 and electrically connected to the metal supporting board 2 via the ground connection portion 7 by forming the base opening 11 extending through in the thickness direction located on one widthwise side (right-hand side) outside the region S where the one pair of wires 9a and 9b are opposed, and the ground connection portion 7 on the metal supporting board 2 exposed from the base opening 11 to contact with the metal supporting board 2 and with the semiconductive layer 5.

As a result, the conductive pattern 4 is electrically connected to the metal supporting board 2 via the semiconductive layer 5 and the ground connection portion 7. This allows efficient removal of the electrostatic charging of the conductive pattern 4.

In addition, since the semiconductive layer 5 is not in contact with the metal supporting board 2 on either widthwise sides outside the region S where the one pair of wires 9a and 9b are opposed, ion migration from the metal supporting board 2 into the insulating cover layer 6 can be reliably prevented.

Figure 6:
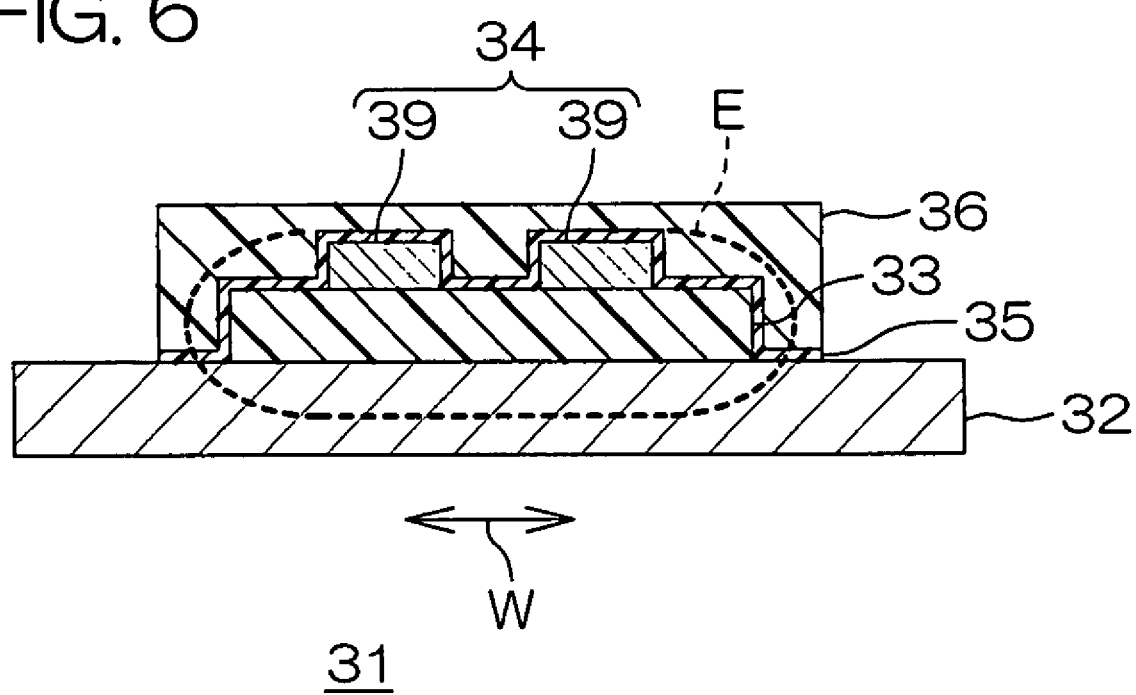
FIG. 6 is a cross-sectional view in the widthwise direction of a conventional suspension board with circuit.

Moreover, since the semiconductive layer 5 is electrically connected to the metal supporting board 2 via the ground connection portion 7 on one widthwise side (right-hand side) outside the region S where the one pair of wires 9a and 9b are opposed, while it is electrically interrupted from the metal supporting board 2 on the other widthwise side (left-hand side) outside the region S where the one pair of wires 9a and 9b are opposed, even when the potential difference is produced between the one pair of wires 9a and 9b, the formation of an electric field, i.e., the electric field E in a loop-like shape as indicated by the dotted line in FIG. 6 around the one pair of wires 9a and 9b can be reliably prevented.

This allows more reliable prevention of ion migration from the metal supporting board 2 into the insulating cover layer 6.

As a result, it is possible to reliably prevent the electrostatic breakdown of the electronic component mounted thereon and improve the connection reliability of the suspension board with circuit 1.

In the description given above, the base opening 11 is formed only in the portion of the insulating base layer 3 located on one widthwise side (right-hand side of FIG. 4) outside the region S where the one pair of wires 9a and 9b are opposed and the ground connection portion 7 is formed on the metal supporting board 2 exposed from the base opening 11. However, it is also possible to form the base opening 11 in, e.g., the portion of the insulating base layer 3 on the other widthwise side (left-hand side) outside the region S where the one pair of wires 9a and 9b and form the ground connection portion 7 on the metal supporting board 2 exposed from the base opening 11.

More specifically, though it is not illustrated, the base opening 11 is formed in the portion of the insulating base layer 3 located on the widthwise side (left-hand side) outside the other (widthwise outer) wire 9d forming the other pair of wires 9 and the ground connection portion 7 is formed on the metal supporting board 2 exposed from the base opening 11, while the base opening 11 is not formed in the portion of the insulating base layer 3 located on one widthwise side (right-hand side) outside the region S where the one pair of wires 9a and 9b are opposed, i.e., in the portion of the insulating base layer 3 located on the widthwise side (right-hand side) outside the one (widthwise outer) wire 9a forming the one pair of wires 9.

Alternatively, the base opening 11 extending through in the thickness direction is formed in the portion of the insulating base layer 3 located between the other (widthwise inner) wire 9b forming the one pair of wires 9 and the one (widthwise inner) wire 9c forming the other pair of wires 9, as indicated by the dotted line in FIG. 4, and the ground connection portion 7 is formed on the metal supporting board 2 exposed from the base opening 11, while the base opening 11 is not formed in the portion of the insulating base layer 3 located on one widthwise side (right-hand side) outside the region S where the one pair of wires 9a and 9b are opposed, i.e., in the portion of the insulating layer 3 located on the widthwise side (right-hand side) outside the one (widthwise outer) wire 9a forming the one pair of wires 9.

Although the description is given above using the region S where the one pair of wires 9a and 9b are opposed as a reference, the same description can be given even when the region S' where the other pair of wires 9c and 9d are opposed is used as a reference.

For example, as shown in FIG. 4, the base opening 11 is formed only in the portion of the insulating base layer 3 located on one widthwise side (right-hand side) outside the region S' where the other pair of wires 9c and 9d are opposed.

No matter which one of the region S where the one pair of wires 9a and 9b are opposed and the region S' where the other pair of wires 9c and 9d are opposed is used as a reference, the suspension board with circuit 1 shown in FIG. 4 has the base opening 11 formed in the portion thereof located on one widthwise side (right-hand side) outside the region S or the region S'.

Although the ground connection portion 7 is formed in a generally rectangular shape when viewed in plan view as indicated by the dotted line in FIG. 1 in the description given above, the shape of the ground connection portion 7 is not limited thereto. The ground connection portion 7 can also be formed in an appropriate shape such as, e.g., a generally circular shape when viewed in plan view.

EXAMPLES

The present invention is described more specifically by showing the examples herein below. However, the present invention is by no means limited to the examples.

Example 1

A metal supporting board made of a stainless steel foil having a thickness of 20 μm was prepared (see FIG. 3(a)).

Then, a varnish of a photosensitive polyamic acid resin was uniformly coated on a surface of the metal supporting board with a spin coater. Subsequently, the coated varnish was heated at 90° C. for 15 minutes to form a base coating. Thereafter, the base coating was exposed to light at 700 mJ/cm$^2$ via a photomask, heated at 190° C. for 10 minutes, developed with an alkaline developer, and cured at 385° C. under a reduced pressure of 1.33 Pa, thereby forming an insulating base layer made of photosensitive polyimide on the metal supporting board to corresponded to the portion where a conductive pattern was formed and the peripheral end portion of the metal supporting board was exposed (see FIG. 3(b)). The thickness of the insulating base layer was 10 μm.

Then, a conductive pattern made of a copper foil and having a thickness of 10 μm was formed by an additive method on the upper surface of the insulating base layer to serve as a wired circuit pattern (see FIG. 3(c)). The width of each of wires was 20 μm and the spacing between the wires was 20 μm.

Thereafter, a metal thin film composed of a nickel thin film having a thickness of 0.15 μm was formed on the upper and side surfaces of the conductive pattern by electroless nickel plating.

Then, a sputtering coating composed of a chromium thin film was formed on the respective surfaces of the metal thin film formed on the surface of the conductive pattern, the insulating base layer, and the metal supporting board by sputtering chromium as a target.

The sputtering was performed under the following conditions by a method in accordance with the description of Japanese Unexamined Patent Publication No. 2004-335700.

Target: Cr
Ultimate Degree of Vacuum: $1.33 \times 10^{-3}$ Pa
Flow Rate of Introduced Gas (Ar): $2.0 \times 10^{-3}$ m$^3$/hour
Operating Pressure: 0.16 Pa
Temperature of Earth Electrode: 20° C.
Electric Power: DC 180 W
Sputtering Time: 3 Seconds
Thickness of Sputtering Coating: 100 nm Then, the surface of the sputtering coating composed of the chromium thin film was oxidized by heating in an atmosphere at 125° C. for 12 hours to form a semiconductive layer composed of a chromium oxide layer (see FIG. 3(d)). The thickness of the chromium oxide layer was 100 nm.

The formation of the semiconductive layer composed of the chromium oxide layer was confirmed by ESCA. As a result of measuring the surface resistance value of the semiconductive layer at a temperature of 25° C. and a humidity of 15% using a surface resistance measuring device (Hiresta-up MCP-HT450 available from Mitsubishi Chemical Corporation), it was $3\times10^6$ Ω/□.

Then, the varnish of the photosensitive polyamic acid resin mentioned above was uniformly coated on the surface of the semiconductive layer with a spin coater and heated at 90° C. for 10 minutes to form a cover coating having a thickness of 7 μm. Then, the cover coating was exposed to light at 700 mJ/cm$^2$ via a photomask, heated at 180° C. for 10 minutes, and developed with an alkaline developer to be patterned. Thereafter, the patterned cover coating was cured at 385° C. under a reduced pressure of 1.33 Pa. In this manner, an insulating cover layer made of the photosensitive polyimide was formed on the upper and side surfaces of the semiconductive layer formed on the upper and side surfaces of the conductive pattern, on the upper surface and one widthwise outer side surface of the semiconductive layer formed on the upper and side surfaces of the insulating base layer, and on the upper surface of the metal supporting board on one widthwise side (right-hand side) outside a region where one pair of the wires are opposed (see FIG. 3(e)). The thickness of the insulating cover layer was 5 μm.

Subsequently, the semiconductive layer exposed from the insulating cover layer was removed by wet etching using the insulating cover layer as an etching resist and an aqueous potassium hydroxide solution (see FIG. 3(f)). The length of a contact portion between the semiconductive layer and the upper surface of the metal supporting board was 10 mm and the width thereof was 200 μm.

Then, the metal thin film formed on the upper surface of each terminal portion was removed by etching.

Thereafter, a metal plating layer was formed on the surface of the terminal portion and cut out by chemical etching to form a gimbal and then trimmed, whereby a suspension board with circuit was obtained (see FIG. 1).

Example 2

A metal supporting board made of a stainless steel foil having a thickness of 20 μm was prepared (see FIG. 5(a)).

Then, a varnish of a photosensitive polyamic acid resin was uniformly coated on a surface of the metal supporting board with a spin coater. Subsequently, the coated varnish was heated at 90° C. for 15 minutes to form a base coating. Thereafter, the base coating was exposed to light at 700 mJ/cm$^2$ via a photomask, heated at 190° C. for 10 minutes, developed with an alkaline developer, and cured at 385° C. under a reduced pressure of 1.33 Pa, thereby forming an insulating base layer made of photosensitive polyimide on the metal supporting board to corresponded to the portion where a conductive pattern was formed and a base opening was formed therein (see FIG. 5(b)). The thickness of the insulating base layer was 10 μm. The base opening was in a rectangular shape when viewed in plan view having a width of 80 μm and a length of 100 μm.

Then, a conductive pattern made of a copper foil and having a thickness of 10 μm was formed by an additive method on the upper surface of the insulating base layer as a wired circuit pattern, while a ground connection portion made of copper was simultaneously formed on the metal supporting board exposed from the base opening of the insulating base layer such that the lower part thereof fills in the base opening of the insulating base layer and the upper part thereof covers the end edge of the base opening (see FIG. 5(c)). Each of the upper part and lower part of the ground connection portion was in a rectangular shape when viewed in plan view. The lower part had a width of 80 μm and a length of 100 μm. The upper part had a width of 120 μm, a length of 140 μm, and a thickness of 5 μm.

Thereafter, a metal thin film composed of a nickel thin film having a thickness of 0.15 μm was formed on the upper and side surfaces of the conductive pattern, and on the upper and side surfaces of the upper part of the ground connection portion by electroless nickel plating.

Then, a sputtering coating composed of a chromium thin film was formed on the respective surfaces of the metal thin film formed on the respective surfaces of the conductive pattern and the ground connection portion, the insulating base layer, and the metal supporting board by sputtering chromium as a target.

The sputtering was performed under the following conditions by a method in accordance with the description of Japanese Unexamined Patent Publication No. 2004-335700.

Target: Cr
Ultimate Degree of Vacuum: $1.33\times10^{-3}$ Pa
Flow Rate of Introduced Gas (Ar): $2.0\times10^{-3}$ m$^3$/hour
Operating Pressure: 0.16 Pa
Temperature of Earth Electrode: 20° C.
Electric Power: DC 180 W
Sputtering Time: 3 Seconds
Thickness of Sputtering Coating: 100 nm Then, the surface of the sputtering coating composed of the chromium thin film was oxidized by heating in an atmosphere at 125° C. for 12 hours to form a semiconductive layer composed of a chromium oxide layer (see FIG. 5(d)). The thickness of the chromium oxide layer was 100 nm.

The formation of the semiconductive layer composed of the chromium oxide layer was confirmed by ESCA. As a result of measuring the surface resistance value of the semiconductive layer at a temperature of 25° C. and a humidity of 15% using a surface resistance measuring device (Hiresta-up MCP-HT450 available from Mitsubishi Chemical Corporation), it was $3\times10^6$ Ω/□.

Then, the varnish of the photosensitive polyamic acid resin mentioned above was uniformly coated on the surface of the semiconductive layer with a spin coater and heated at 90° C. for 10 minutes to form a cover coating having a thickness of 7 μm. Then, the cover coating was exposed to light at 700 mJ/cm$^2$ via a photomask, heated at 180° C. for 10 minutes, and developed with an alkaline developer to be patterned. Thereafter, the patterned cover coating was cured at 385° C. under a reduced pressure of 1.33 Pa. In this manner, an insulating cover layer made of the photosensitive polyimide was formed to expose the semiconductive layer formed on the surface of each of the peripheral end portions of the insulating base layer on both widthwise sides outside the region where one pair of wires are opposed (see FIG. 5(e)). The thickness of the insulating cover layer was 5 μm.

Subsequently, the semiconductive layer exposed from the insulating cover layer was removed by wet etching using the insulating cover layer as an etching resist and an aqueous potassium hydroxide solution (see FIG. 5(f)).

Then, the metal thin film formed on the upper surface of each terminal portion was removed by etching.

Thereafter, a metal plating layer was formed on the surface of the terminal portion and cut out by chemical etching to form a gimbal and then trimmed, whereby a suspension board with circuit was obtained (see FIG. 1).

(Evaluation)

To each of the suspension boards with circuits obtained in Examples 1 and 2, a voltage of 6 V was applied for 1000 hours in an atmosphere at 85° C. and 85% RH.

The result confirms by sectional SEM observation and element analysis that ion migration from the metal supporting board into the insulating cover layer made of stainless steel did not occur in either of the suspension board with circuit of Examples 1 and 2.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board comprising:
a flat metal supporting board;
an insulating base layer formed on the metal supporting board;
a conductive pattern formed on the insulating base layer and including at least one pair of wires arranged in mutually spaced-apart and opposed relation, each of the wires having different potential;
a semiconductive layer formed on the insulating base layer to cover the conductive pattern and electrically connected to the metal supporting board on one side outside a region where the pair of wires are opposed; and
an insulating cover layer formed on the semiconductive layer.

2. A wired circuit board comprising:
a metal supporting board;
an insulating base layer formed on the metal supporting board;
a conductive pattern formed on the insulating base layer and including at least one pair of wires arranged in mutually spaced-apart and opposed relation, each of the wires having different potential;
a semiconductive layer formed on the insulating base layer to cover the conductive pattern and electrically connected to the metal supporting board on one side outside a region where the pair of wires are opposed, wherein the semiconductive layer is in contact with the metal supporting board on one side outside the region where the pair of wires are opposed; and
an insulating cover layer formed on the semiconductive layer.

3. A wired circuit board comprising:
a metal supporting board;
an insulating base layer formed on the metal supporting board;
a conductive pattern formed on the insulating base layer and including at least one pair of wires arranged in mutually spaced-apart and opposed relation, each of the wires having different potential;
a semiconductive layer formed on the insulating base layer to cover the conductive pattern and electrically connected to the metal supporting board on one side outside a region where the pair of wires are opposed; and
an insulating cover layer formed on the semiconductive layer,
wherein the insulating base layer has a base opening formed in a thickness direction thereof, in a portion of the insulating base layer located on one side outside the region where the pair of wires are opposed; and
wherein a ground connection portion in contact with the metal supporting board and the semiconductive layer is provided on the metal supporting board exposed from the base opening.

* * * * *